INVENTOR
Louis G. Bailey

BY John T. Graham
ATTORNEY

United States Patent Office 3,403,439

Patented Oct. 1, 1968

3,403,439
ELECTRICAL ISOLATION OF CIRCUIT COMPONENTS OF MONOLITHIC INTEGRATED CIRCUITS

Louis Glen Bailey, Dallas, Tex., assignor to Texas Instruments Incorporated, Dallas, Tex., a corporation of Delaware Filed Apr. 29, 1966, Ser. No. 546,232
6 Claims. (Cl. 29—578)

This invention relates to integrated circuits, and more particularly to monolithic integrated circuits of the type having circuit components joined together by a common substrate but electrically isolated from one another throughout the substrate.

The substantial growth and interest in microminiaturization, especially in that area of electronics commonly referred to as microelectronics, has been reflected in the semiconductor field by the rapid development of integrated circuitry, and particularly monolithic integrated circuitry. By monolithic integrated circuitry is meant the formation of individual active and/or passive circuit components for an electronic circuit in or on a single slice of semiconductor material, preferably single crystalline, the components being interconnected to form the desired circuit network. Attaining satisfactory electrical isolation between these circuit components, however, has been one of the prime objectives of integrated circuit development.

Many techniques have been developed to achieve this objective, all of them possessing certain disadvantages. For example, P-N junction isolation has an additional capacitance associated with it that produces undesirable couplings at high frequencies. In addition, it is often necessary to specially design the circuits so that the isolation junctions are not forward biased at any time under normal operating conditions of the circuit. Various other isolation approaches have been devised, with various advantages and disadvantages associated with each technique.

It is therefore one object of this invention to provide an improved method of electrical isolation in integrated circuitry whereby all of the circuit components of a monolithic integrated circuit are joined by a common substrate and yet are electrically isolated from one another throughout the substrate. It is another object of the invention to provide a method of electrical isolation of circuit components in a monolithic integrated circuit utilizing an isolation means having a reduced capacitance associated with it, thereby allowing the particular integrated circuit to be used at very high frequencies and for very fast switching applications.

In accordance with these and other objects, features and improvements, the invention is generally directed to the formation of pockets or holes within a semiconductor substrate, each pocket being formed so that a portion thereof is substantially perpendicular to the surface of the semiconductor substrate, the remaining portions of the pocket sloping from the base of the pocket to the semiconductor surface. Insulating material is then selectively located upon the sloping portions of the pocket and single crystalline semiconductor material is thereafter selectively epitaxially grown from the uncovered perpendicular portion of the pockets to bury the insulating material. A similar procedure is carried out immediately adjacent these originally formed pockets, resulting in redeposited regions of single crystalline semiconductor material electrically isolated from one another throughout the substrate by the insulating material, these isolated single crystalline regions serving as areas into which individual components of an integrated circuit may be formed. Thus, each of the electronic components will be formed within a monolithic substrate but electrically isolated throughout the substrate.

The novel features believed to be characteristic of this invention are set forth with particularity in the appended claims. The invention itself, however, as well as further objects and advantages thereof may best be understood by reference to the following detailed description read in conjunction with the appended claims and the drawings, wherein:

The drawings are not necessarily to scale as dimensions of certain parts as shown have been modified and/or exaggerated for the purpose of clarity of illustration.

Figure 1:
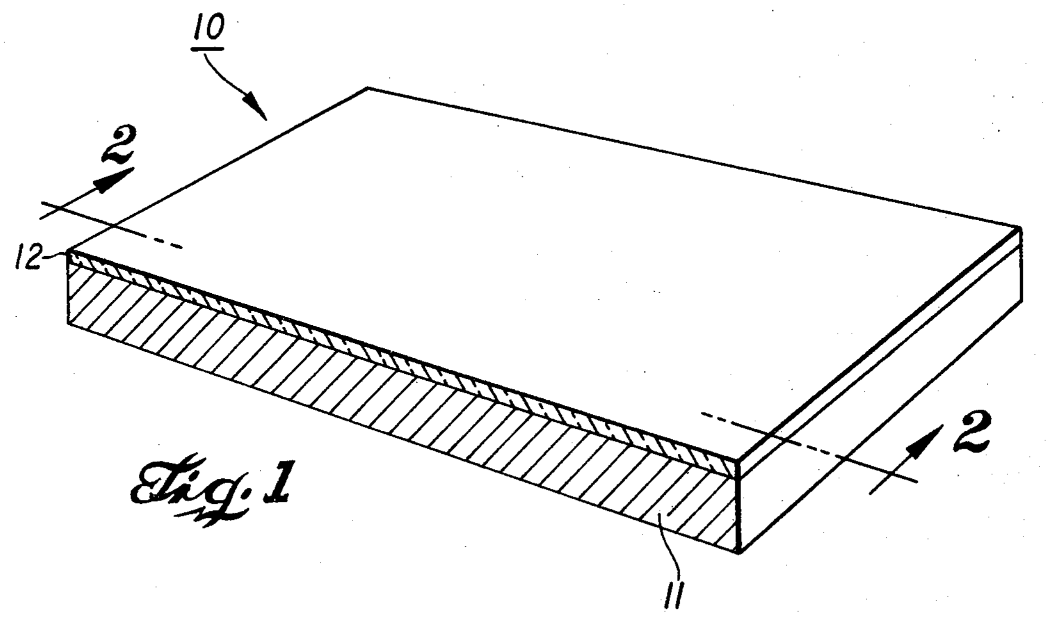
FIGURES 1 and 2 are pictorial views in section of a semiconductor wafer in the early stages of the production of an integrated circuit in accordance with the process of this invention.

Referring now to FIGURE 1, there is described the first step in the method of this invention. A slice of single crystal semiconductor material is used as a starting material. This slice may be approximately 1 inch in diameter and 10 mils thick. A small segment of the slice may be represented as a chip or wafer 10 which represents the segment occupied by one integrated circuit. Actually, the slice would contain dozens or even hundreds of the segments such as the wafer 10. The top surface of the slice composed of the semiconductor material 11 is coated with an insulating coating 12, silicon oxide for example, which may be formed by any conventional technique to a thickness of perhaps 10,000 A. For example, when the semiconductor substrate 11 is of silicon, the insulating coating 12 may be thermally grown by heating the substrate in the presence of oxygen. When the substrate 11 is other than silicon, the layer 12 is deposited rather than grown.

Figure 2:
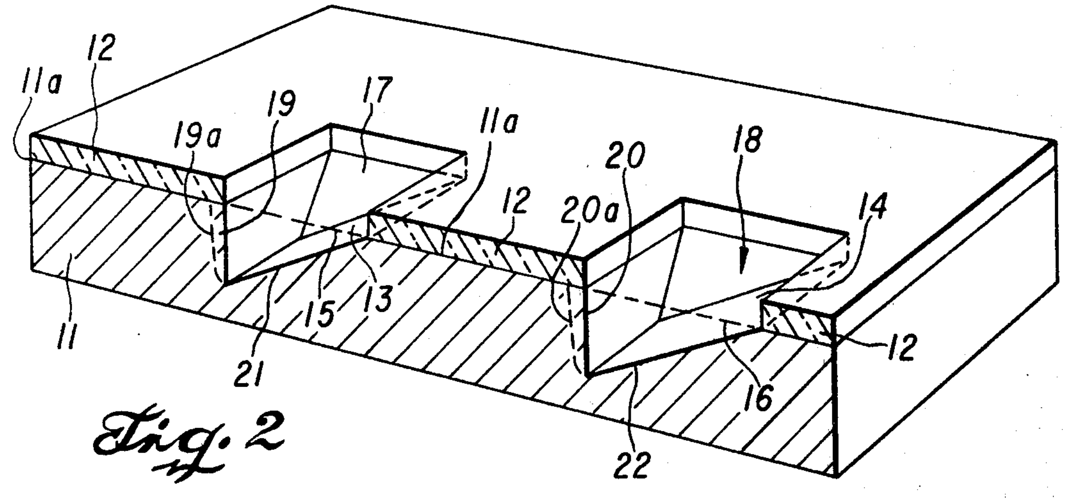

Using conventional photographic masking and etching techniques, portions of the oxide layer 12 are removed to form windows 13 and 14 in the oxide layer 12, exposing corresponding portions of semiconductor material beneath them, as indicated by the dotted lines 15 and 16, respectively. The semiconductor material beneath the dotted lines 15 and 16 is then selectively removed to provide holes or pockets 17 and 18, respectively, within the semiconductor body 11, whereby each of the holes or pockets 17 and 18 has one of its walls (19 and 20) substantially perpendicular to the top surface 11*a* of the substrate 11, while the other walls or portions of the holes 17 and 18 slope gradually to the surface 11*a* as shown in FIGURE 2. The removal of the semiconductor material to form the pockets 17 and 18 to the desired size and shape may be accomplished by various techniques. A solution etch, for example, may be used which removes the semiconductor material but does not substantially affect the masking layer 12, and by controlling the fluid flow of the solution etch, the particular shape may be attained. As another example, a series of photographic masking and etching steps may be utilized to form the shapes illustrated in FIGURE 2. In lieu of etching techniques, it may be even desirable, as still another example, to cut out the pockets 17 and 18 with an electron beam.

Figure 3:
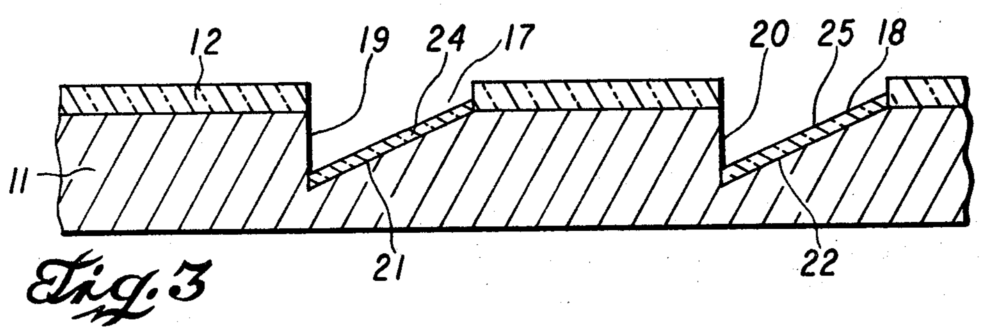
FIGURES 3–5 are sectional views of a portion of the wafer taken along the section line 2—2 of FIGURE 1; showing subsequent steps of the process of the invention.

The shape of the holes or pockets 17 and 18 shown in FIGURE 2 are not to be construed in a restrictive sense; the number of walls of the pocket need not be limited to any specific number so long as one wall or one portion of each pocket is substantially perpendicular to the surface 11*a*. In addition, the sloping walls 21 and 22, for example, need not be a straight line, as depicted in FIGURES 2 and 3, but may be somewhat convex or concave. The perpendicular walls 19 and 20 of the holes 17 and 18, respectively, although depicted in FIGURE 2 as lining up directly with the edge of the oxide layer 12 may, in actuality, occur as represented by the dotted lines 19*a* and 20*a*, respectively, due to lateral undercutting of the oxide mask 12.

Referring now to FIGURE 3, layers 24 and 25 of insulating material, such as silicon oxide, are selectively placed upon the sloping portions or walls 21 and 22, respectively. This selective placement of the layers 24 and 25 may be accomplished by thermally growing or depositing the insulating material within the pockets 17 and 18 so as to cover all of the walls of the pockets, and thereafter, using conventional photographic masking and etching techniques, selectively removing the portions of the insulating layer which cover the perpendicular walls 19 and 20 so that the only insulating oxide that remains within these pockets are the portions 24 and 25 covering the sloping walls 21 and 22 (as well as the other sloping walls). As an alternative to growing or depositing oxide upon all of the walls of the pockets and then selectively removing portions thereof, as above described, it may be desirable to initially selectively deposit the insulating layers 24 and 25 solely on all of the sloping walls, including walls 21 and 22.

Figure 4:
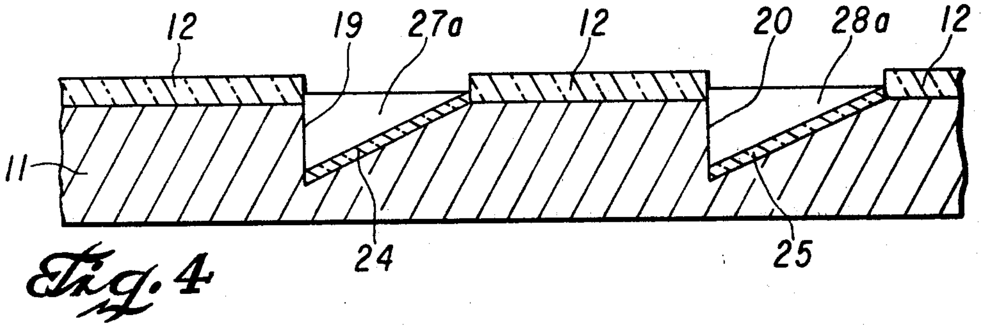

As the next step of the invention, referring to FIGURE 4, regions 27*a* and 28*a* are selectively and epitaxially filled with single crystalline semiconductor material through the openings in the oxide mask 12, as shown in said FIGURE 4. The epitaxial deposition will nucleate from the uncoated walls 19 and 20 and proceed substantially laterally to bury the oxide layers 24 and 25.

Figure 5:
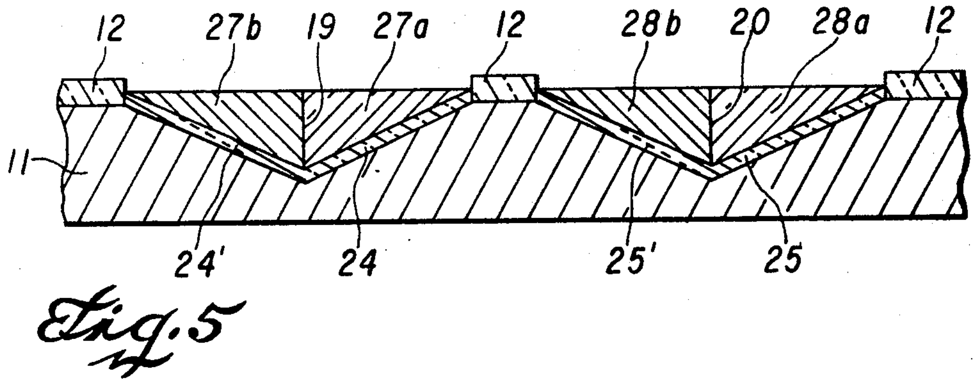

In an identical manner, proceeding through the same steps described with reference to FIGURES 2–4 (photographic masking and etching of the oxide mask 12, selective removal of the semi-conductor material 11, selective placement of insulating material 24' and 25' on the sloping wall or walls, and selective epitaxial regrowth of single crystalline semiconductor material from the common wall 19 over the layers 24' and 25' there is provided the regions 27*b* and 28*b* adjacent the regions 27*a* and 28*a*, respectively, as illustrated in FIGURE 5 the isolation layers 24' and 25' intersecting the layers 24 and 25, respectively. Although the regions 27*a* and 28*a* are shown in the figure as cross-hatched in an opposite direction from the regions 27*b* and 28*b*, this does not mean that the crystallographic orientations are different. The variation in cross-hatching is only used to more clearly illustrate the two deposited regions. In fact, the regions 27*b* and 28*b* are epitaxial to the regions 27*a* and 28*a*, respectively, being crystallographic extensions of the walls 19 and 20 of the regions 27*a* and 28*a*. In addition, although the isolation layers 24' and 25' are depicted as intersecting the isolation layers 24 and 25 evenly, in fact, these layers 24' and 24, and 25 and 25' may somewhat overlap, the critical point being that the pockets 27 ($a+b$) and 28 ($a+b$) are electrically isolated from the substrate 11.

As a consequence of the above described process steps, the region 27 (*a* and *b*), and the region 28 (*a* and *b*) serve as single crystalline semiconductor regions into which active and/or passive components of an integrated circuit may be fabricated, these single crystalline regions being electrically isolated from each other and the substrate 11 by the layers of insulating material 24 and 25.

Various types of semiconductor materials may be used for the slice 11. More specific aspects of the present invention, however, will now be described when the starting material of the slice 11 is gallium arsenide and the insulating layers 24 and 25 are formed of silicon oxide (dioxide). When a solution etch is used to selectively remove portions of the substrate 11 to form the pockets 17 and 18, and gallium arsenide is used as the starting semiconductor material, $Br_2$-methanol mixture may be used as the solution etch to form the pockets.

The selective epitaxial growth of the single crystalline semiconductor regions 27 (*a* and *b*), and 28 (*a* and *b*) is accomplished by a technique which causes preferential growth only upon the exposed semiconductor wall (or walls) 19 and 20 due to the crystal propagation of this exposed semiconductor material. One such technique is described with reference to FIGURE 6 wherein apparatus suitable for the epitaxial growth of gallium arsenide regions 27*a* and 28*a*, for example, is shown. The apparatus comprises an elongated quartz reaction vessel 30 having two inlets 31 and 32 and an exhaust 33. A constriction 34 is provided within the vessel 30 which contains a given amount of high purity gallium or gallium arsenide 35. The constriction 34 is so constructed as to cause gas entering through inlet 31 to engage the material 35 as it flows out of the constriction through openings 34*a*, and into the reaction cavity of the vessel. The reaction vessel 30 is positioned within an appropriate furnace having two separately controlled temperature zones as shown at 52 and 53, the zone 52 being maintained at a higher temperature than the zone 53.

A liquid halide 50 of arsenic, for example $AsCl_3$, is contained within a closed vessel, or bubbler 44. The bubbler is only partially filled to leave a vapor contained space above the liquid. A temperature controlling device 56 is disposed about the bubbler 44 to provide additional control over the amount of $AsCl_3$ admitted into the reaction vessel 30.

Figure 6:
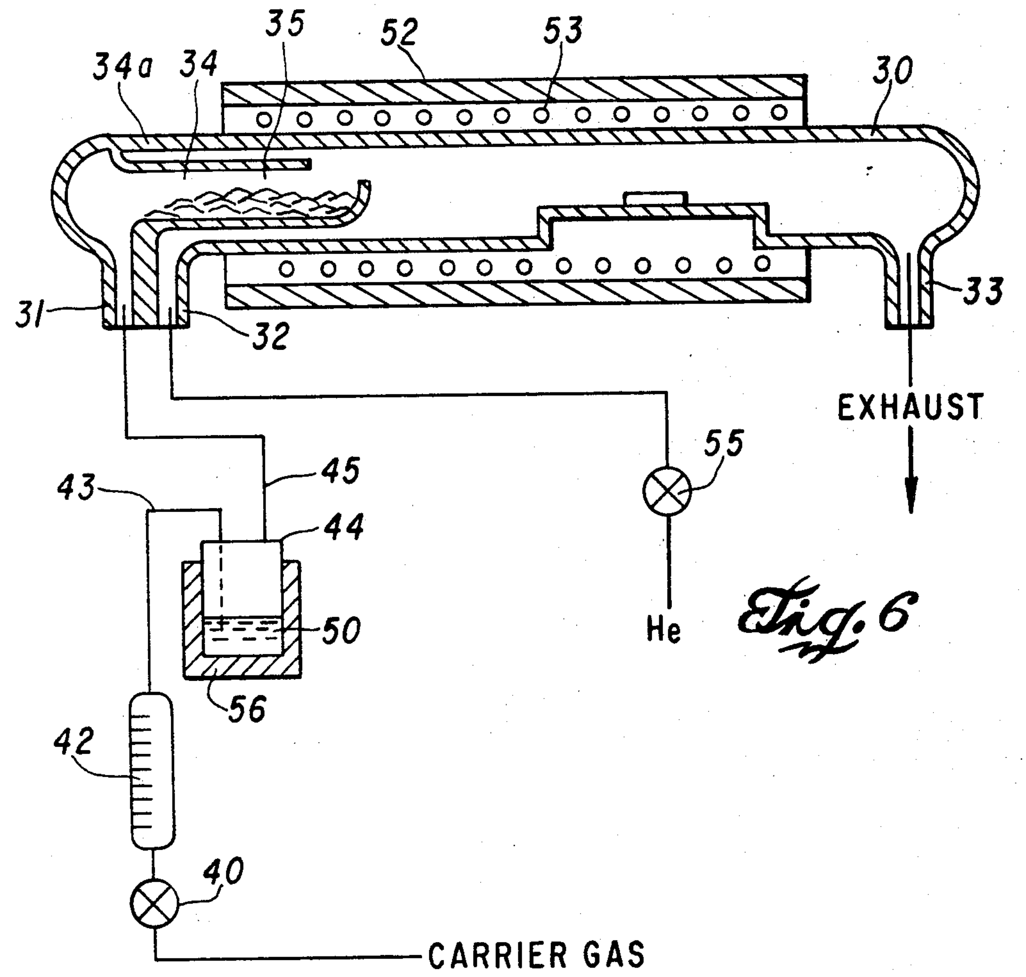
FIGURE 6 is a schematic view, partially in section, of one form of the apparatus utilized for the selective epitaxial deposition step of the invention.

The structure shown in FIGURE 2, the semiconductor substrate 11 with the pockets 17 and 18 formed therein and with the oxide mask 12 upon a surface 11*a* thereof, is placed in the reaction vessel 30, as shown in FIGURE 6, in which the structure is represented as the body 60. The reaction vessel is then flushed with dry helium admitted through the valve 55 in order to flush atmospheric gases such as oxygen and water vapor from the reaction vessel. The individually controlled furnace zones 52 and 53 are activated to raise the temperature of the material 35 and the body 60 to approximately 900° C. and 750° C., respectively.

A carrier gas, for example hydrogen, is admitted into the reaction chamber through a valve 40, the gas passing through a flow meter 42 and tube 43, the tube 43 having its open end submerged in the liquid $AsCl_3$. The liquid $AsCl_3$ in the bubbler 44 is maintained at room temperature. The gas passing through the tube 43 is admitted below the surface of the liquid 50 near the bottom of the bubbler 44. Gas so admitted rises to the surface of the liquid in small bubbles and thus becomes saturated with vapor of liquid $AsCl_3$. The saturated gas leaves the bubbler 44 by way of an exit tube 45 feeding into the reaction vessel 30 through inlet 31, and passes over the gallium or gallium arsenide material 35 within the constriction 34. The resultant gases are swept into the reaction vessel cavity over the substrate 60 where there results the deposition of gallium arsenide.

Doping may be achieved by adding the appropriate impurities to the carrier gas, into the feed material 35, or they may also be included in suitable form in the halide solution 50. In this particular example, N-type doping is desired for the epitaxially grown regions 27 (*a* and *b*) and 28 (*a* and *b*) and so this doping may be achieved by adding $H_2S$ to the carrier gas or by adding impurities such as tin and tellurium to the feed material 35.

In order to insure that substantially no nucleation or growth occurs upon the oxide layers 24 and 25, it might be desirable, prior to the above described epitaxial growth to throughly clean these oxide layers by a suitable technique.

Figure 7:
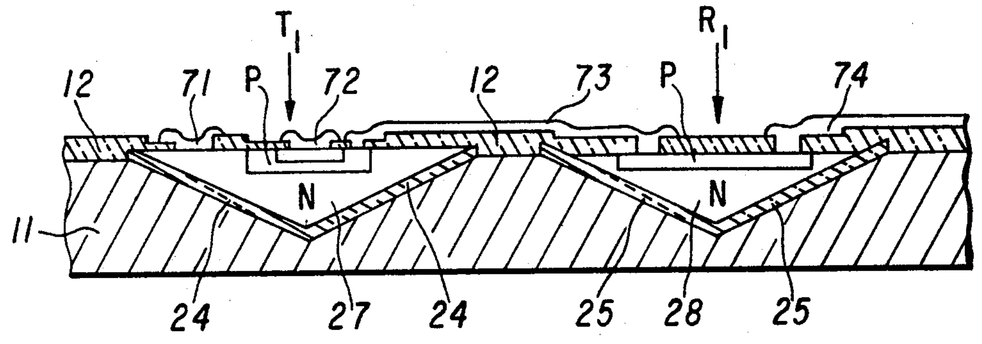
FIGURE 7 is a sectional view of the portion of the wafer described with reference to FIGURES 1–5 illustrating the formation of electronic components within the isolated regions of the wafer and their interconnections.
Figure 8:
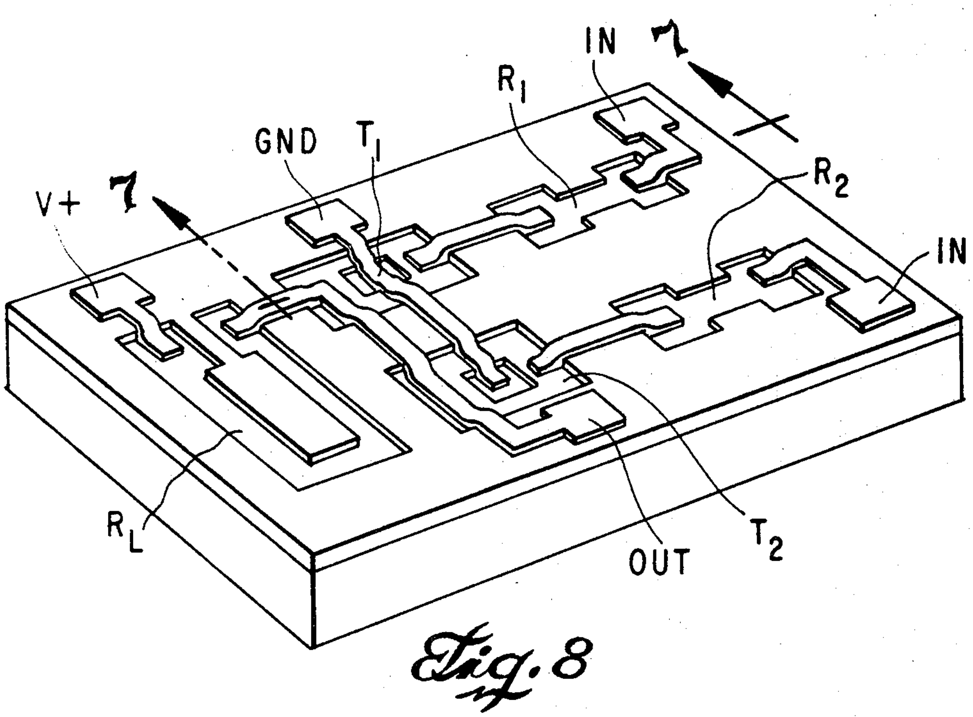
FIGURE 8 is a pictorial view of a completed device described with reference to FIGURES 1–7.
Figure 9:
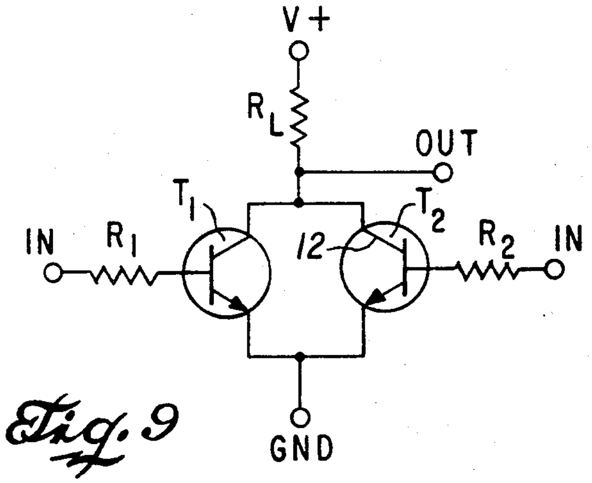
FIGURE 9 is a schematic diagram of the integrated circuit contained within the device shown in FIGURE 8.

Referring back to FIGURE 5, the isolated regions 27 (*a* and *b*) and 28 (*a* and *b*) now serve as regions into which various components of an integrated circuit may be formed. In FIGURE 7, for example, a sectional view of a complete integrated circuit is shown with an NPN transistor $T_1$ and a resistor $R_1$ having been formed by diffusion in the N-type isolated regions 27 and 28, respectively. A P-type diffused region provides the base of the transistor, while an elongated P-type region formed simultaneously with the base provides the resistor $R_1$. An N-type diffused region provides the transistor $T_1$ emitter. The diffusion operations utilize oxide masking so that the oxide layer 12 acquires a stepped configuration in the final device. Openings are made in the oxide where contact is necessary, then metal film is deposited over the oxide and selectively removed to provide contacts and interconnections, such as the collector contact 71, the emitter contact 72 and the base contact 73, the latter interconnecting with one end of the P region of the resistor $R_1$, while interconnector 74 connects with the other end of the P-type region of the resistor $R_1$. The complete unit is seen in FIGURE 8 with the transistors $T_1$ and $T_2$ and the resistors $R_1$, $R_2$ and $R_L$, along with the metal film interconnecting providing a logic circuit as seen in schematic form in FIGURE 9.

Using the method of this invention, a multitude of configuration of circuit components may be formed within a single substrate, each component being electrically isolated from one another through the substrate.

While the invention has been described with reference to a specific method, it is to be understood that the invention is not to be considered in a limiting sense. Various modifications of the process of the invention as well as its use to form varying structures both in integrated and discrete form will become apparent to persons skilled in the art without departing from the spirit and the scope of the invention as defined by the appended claims.

What is claimed is:

1. In a method for fabricating electronic components within a single semiconductor substrate, the steps of (a) selectively removing a portion of semiconductor material to form a pocket within said semiconductor substrate, said pocket having a portion of its perimeter extending from the base of said pocket to a surface of said substrate and being substantially perpendicular to said surface, the remaining perimeter of said pocket sloping from the base of said pocket to said surface, (b) selectively applying insulating material on said remaining perimeter of said pocket, said substantially perpendicular portion of the perimeter of said pocket remaining exposed semiconductor material, and (c) selectively epitaxially growing single crystalline semiconductor material from said substantially perpendicular portion of the perimeter of said pocket to bury said insulating material.

2. In a method for fabricating an integrated network of circuit components within a substrate of semiconductor material, the steps of (a) selectively removing a portion of said substrate from one location upon a major surface of said substrate to form a first pocket at said location within said substrate, said first pocekt having one portion of its perimeter extending from the base of said pocket to the said major surface and being substantially perpendicular to said major surface, the remaining portion of the perimeter of said pocket sloping from the base of said first pocket to said major surface, (b) selectively locating insulating material on the remaining portion of the perimeter of said pocket, said substantially perpendicular portion of the perimeter of said pocket remaining exposed semiconductor material, (c) selectively epitaxially growing single crystalline semiconductor material from said substantially perpendicular portion of the perimeter of said first pocket to bury said insulating material, (d) selectively removing another portion of said substrate at a second location adjacent to said first location upon said major surface of said substrate to form a second pocket at said second location within said substrate, said second pocket having one portion of its perimeter extending from the base of said second pocket to the said major surface and being substantially perpendicular to said major surface, the remaining portion of the perimeter of said second pocket intersecting said selectively coated remaining portion of the perimeter of said first pocket and sloping to said major surface, (e) selectively coating insulating material on said remaining portion of the perimeter of said second pocket, said substantially perpendicular portion of the perimeter of said first pocket remaining exposed semiconductor material, and (f) selectively epitaxially growing single crystalline semiconductor material from said substantially perpendicular portion of the perimeter of said second pocket to bury said insulating material on said remaining portion of the perimeter of said second pocket.

3. A method for fabricating an integrated network within a monolithic semiconductor substrate comprising the steps of:

(a) selectively removing a plurality of first portions of said semiconductor substrate at first locations upon a major surface of said substrate to form a plurality of first pockets within said substrate, each of said plurality of first pockets having one portion of the perimeter thereof extending from the base of said pockets to the said major surface and being substantially perpendicular to said major surface, the remaining portion of the perimeter of each of said first pockets sloping from the base of said pockets to said major surface, (b) selectively applying insulating material on said remaining portions of the perimeter, said substantially perpendicular portion of the perimeter of each of said first pockets remaining exposed semiconductor material, (c) selectively epitaxially growing single crystalline semiconductor material from said substantially perpendicular portion of the perimeter of each of said first pockets to bury said insulating material, (d) selectively removing a plurality of second portions of said semiconductor substrate at a plurality of second locations adjacent to said first locations upon a major surface of said substrate, to form a plurality of second pockets within said substrate, each of said plurality of second pockets having a portion of its perimeter extending from the base of said pockets to the said major surface and being substantially perpendicular to said major surface, the remaining portion of the perimeter of each of said second pockets intersecting the said remaining portions of the perimeter of the said first plurality of pockets and sloping to said major surface, (e) selectively placing insulating material on said remaining portions of the perimeter of each of said second plurality of pockets, said substantially perpendicular portion of the perimeter of each of said pockets remaining exposed semiconductor material, and (f) selectively epitaxially growing single crystalline semiconductor material from each of said substantially perpendicular portions of the perimeter of each of said second pockets to bury said insulating material, thereby resulting in a plurality of isolated single crystalline semiconductor regions isolated from said substrate by said selectively placed insulating material.

4. The process as described in claim 3, including the step of forming an individual circuit component within each of said isolated single crystalline semiconductor regions.

5. The process as described in claim 4 wherein said selective removal of said first portions and said second portions is by etching.

6. The process as described in claim 5 wherein the selective locating of said insulating material is accomplished by depositing insulating material within said pockets and selectively removing said insulating material from said substantially perpendicular portion of said pockets.

References Cited

UNITED STATES PATENTS

| | | | |
|---|---|---|---|
| 3,243,323 | 3/1966 | Corrigan et al. | 148—175 |
| 3,322,581 | 5/1967 | Hendrickson et al. | 148—175 |

OTHER REFERENCES

I.B.M. Technical Disclosure Bulletin, vol. 6, No. 6, November 1963, pages 37 and 38.

WILLIAM I. BROOKS, *Primary Examiner.*